(12) United States Patent
Cheng et al.

(10) Patent No.: US 9,173,020 B2
(45) Date of Patent: Oct. 27, 2015

(54) CONTROL METHOD OF SOUND PRODUCING, SOUND PRODUCING APPARATUS, AND PORTABLE APPARATUS

(71) Applicant: HTC Corporation, Taoyuan County (TW)

(72) Inventors: Chih-Chiang Cheng, Taoyuan County (TW); Ting-Wei Sun, Taoyuan County (TW); Hann-Shi Tong, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 320 days.

(21) Appl. No.: 13/752,375

(22) Filed: Jan. 28, 2013

(65) Prior Publication Data
US 2013/0259245 A1    Oct. 3, 2013

Related U.S. Application Data

(60) Provisional application No. 61/615,904, filed on Mar. 27, 2012.

(51) Int. Cl.
| | |
|---|---|
| *H04R 29/00* | (2006.01) |
| *H04R 3/00* | (2006.01) |
| *H04R 3/02* | (2006.01) |
| *H03G 7/00* | (2006.01) |

(52) U.S. Cl.
CPC ............... *H04R 3/00* (2013.01); *H03G 7/002* (2013.01); *H03G 7/007* (2013.01); *H04R 3/007* (2013.01); *H04R 3/02* (2013.01); *H04R 29/001* (2013.01)

(58) Field of Classification Search
None
See application file for complete search history.

(56) References Cited

U.S. PATENT DOCUMENTS

| 5,331,291 A | 7/1994 | D'Agostino et al. |
|---|---|---|
| 6,931,135 B1 | 8/2005 | Kohut |
| 2003/0072462 A1* | 4/2003 | Hlibowicki .................. 381/96 |
| 2011/0135103 A1 | 6/2011 | Sun et al. |

FOREIGN PATENT DOCUMENTS

| CN | 101478711 | 7/2009 |
|---|---|---|
| EP | 2369852 A1 | 9/2011 |
| EP | 2538699 A1 | 12/2012 |

OTHER PUBLICATIONS

Office Action issued by European Patent Office Nov. 4, 2013.
European Search Report Aug. 12, 2013.
"Office Action of Taiwan Counterpart Application", issued on Dec. 1, 2014, p. 1-p. 6.
"Office Action of Europe Counterpart Application", issued on Apr. 24, 2015, p1-p8.

* cited by examiner

*Primary Examiner* — Andrew L Sniezek
(74) *Attorney, Agent, or Firm* — Jianq Chyun IP Office

(57) ABSTRACT

A control method of sound producing, sound producing apparatus, and portable apparatus are provided. The control method of sound producing is for a portable device, including the following steps. (a) A first detected parameter indicating a detected excursion of a speaker of the portable device is generated. (b) A second audio signal is generated based on a first audio signal, wherein the second audio signal is generated selectively by compensation according to at least the first detected parameter. (c) A gain value is determined according to at least the first detected parameter and a third audio signal is generated based on the second audio signal according to the gain value.

20 Claims, 9 Drawing Sheets

CONTROL METHOD OF SOUND PRODUCING, SOUND PRODUCING APPARATUS, AND PORTABLE APPARATUS

This application claims the benefit of U.S. provisional application Ser. No. 61/615,904, filed Mar. 27, 2012, the disclosure of which is incorporated by reference herein in its entirety.

BACKGROUND

1. Technical Field

The disclosed embodiments relate in general to a control method of sound producing, a sound producing apparatus for a portable device, and a portable apparatus.

2. Description of the Related Art

A speaker reproducing audible sound is typically limited to its maximum excursion, temperature rising, transducer's non-linearity and its corresponding amplifier induced nonlinearity. In general, a speaker is driven under a rated power for a long period, and under a maximum power in a short period, which are determined by the manufacturer. The driven power restrictions confine the maximum excursion as well as temperature rising of a speaker in a safe range. For a reproduced signal of a large dynamic range without any distortion, the loudness of the speaker is small, especially for a handheld device under the power restrictions. Consequently, a dynamic range compression (DRC) technology has been introduced in a speaker system for decades so as to trade-off the distortion and loudness under the power restrictions.

SUMMARY

The disclosure is directed to a control method, an apparatus of sound producing, and a portable apparatus.

According to one embodiment, a sound producing apparatus for a portable device is provided. The sound producing apparatus includes a speaker, a feedback unit, a compensation unit, and a gain unit. The speaker is for producing an audible sound. The feedback unit, coupled to the speaker, generates a first detected parameter indicating a detected excursion of the speaker. The compensation unit generates a second audio signal based on a first audio signal, wherein the second audio signal is generated selectively by compensation according to the first detected parameter. The gain unit, coupled to the compensation unit and the feedback unit, determines the a gain value according to the first detected parameter and generating a third audio signal based on the second audio signal according to the gain value.

According to another embodiment, a control method of sound producing for a portable device is provided. The control method includes the following steps. (a) A first detected parameter indicating a detected excursion of a speaker of the portable device is generated. (b) A second audio signal is generated based on a first audio signal, wherein the second audio signal is generated selectively by compensation according to at least the first detected parameter. (c) A gain value is determined according to at least the first detected parameter and a third audio signal is generated based on the second audio signal according to the gain value.

According to another embodiment, a portable apparatus is provided. The portable apparatus includes a processing unit, a speaker, an amplifier coupled to the speaker, and a control apparatus. The processing unit outputs an audio input signal. The control apparatus, coupled between the processing unit and the amplifier, drives the speaker through the amplifier according to a third audio signal. The control apparatus includes a feedback unit, a compensation unit, and a gain unit. The feedback unit, coupled to the speaker, is for generating a first detected parameter indicating a detected excursion of the speaker. The compensation unit is for generating a second audio signal based on a first audio signal, wherein the second audio signal is generated selectively by compensation according to the first detected parameter. The gain unit, coupled to the compensation unit and the feedback unit, is for determining a gain value according to the first detected parameter and generating a third audio signal based on the second audio signal according to the gain value.

Figure 1:
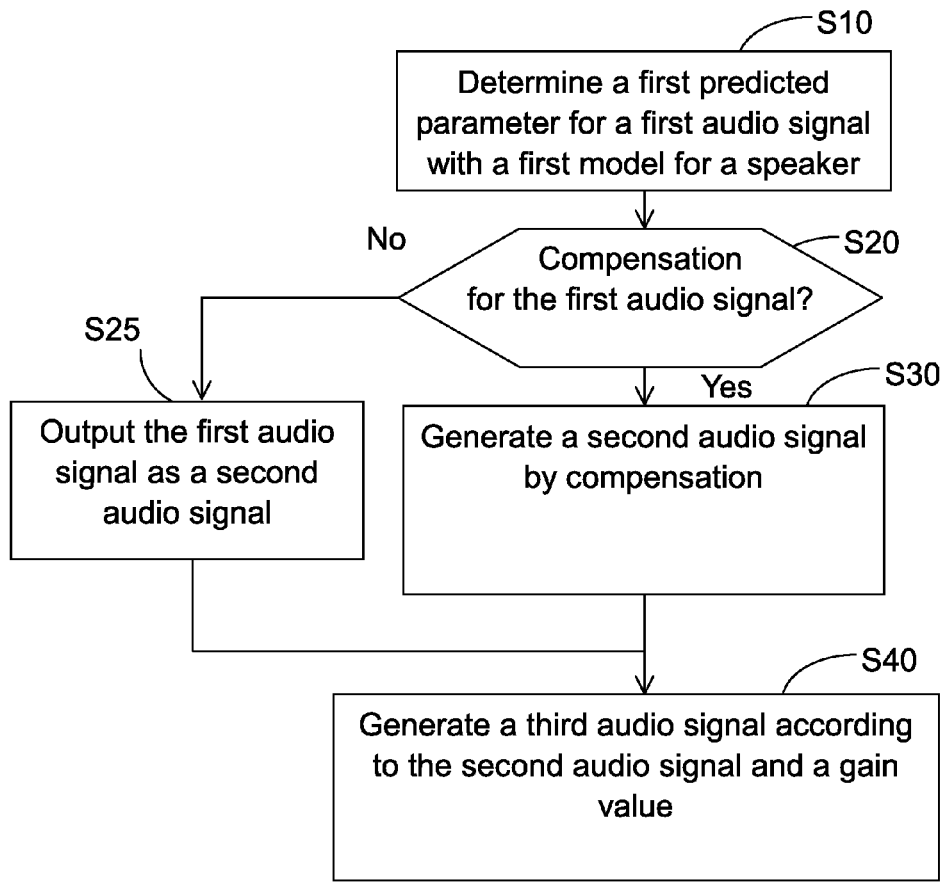
FIG. 1 is a flowchart illustrating a control method for a speaker system according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Embodiments of a control method, a control apparatus, an apparatus of sound producing, and a portable apparatus equipped with a control apparatus are provided.

Figure 2:
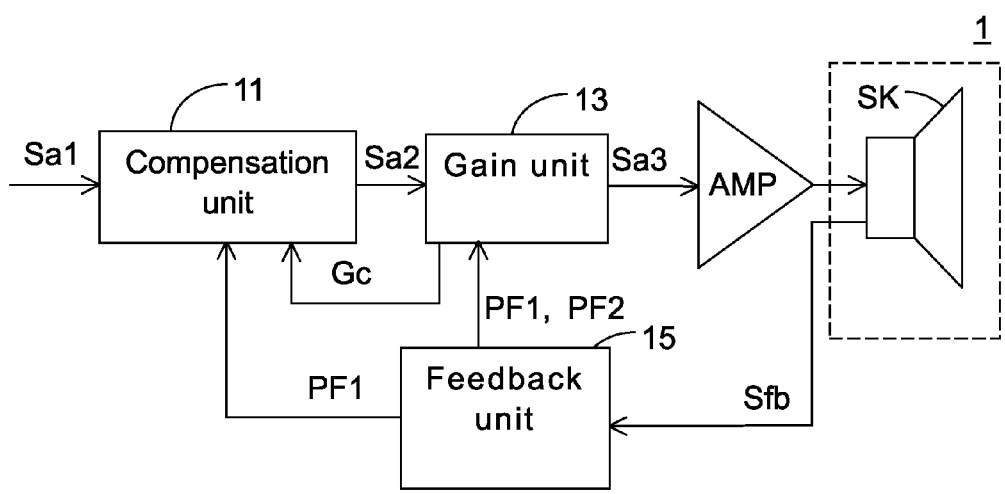
FIG. 2 shows a control apparatus for a speaker system according to an embodiment.

Referring to FIG. 1, a control method for a speaker system according to an embodiment is illustrated. FIG. 2 illustrates a structure for a control apparatus for a speaker SK according to an embodiment, which can be employed to perform the method as recited FIG. 1. The structure for a control apparatus 1 as shown in FIG. 2 includes a compensation unit 11, a gain unit 13, a feedback unit 15. In FIG. 2, an input audio signal (or called a first audio signal) Sa1 is to be amplified by an amplifier AMP so as to be reproduced by the speaker SK.

The control method is to enhance the sound quality, compensate for the distortions of the audible sound reproduced by a speaker system and protect the speaker system, with respect to one or more factors. For example, the audible sound reproduced is limited to the maximum excursion of the speaker system, transducer and amplifier's non-linearity, temperature rising, etc. The damage of a speaker may occur due to high temperature and diaphragm vibration over maximum excursion. In addition, the sound quality would degrade due to the distortions resulting from the non-linear behavior of a speaker unit when the diaphragm vibrates close to its maximum excursion and the amplifier nonlinearity itself when some switching power amplifiers such as a class D amplifier, etc., are adopted. For different applications and requirements for sound quality and hardware protection, one or more factors can be employed in different implementations of the control method.

As indicated in FIG. 1, the method considers compensation for the first audio signal by using a first model for a speaker system, wherein the first model indicates a physical model of the speaker system. In step S10, a first predicted parameter, such as a corresponding excursion of the speaker SK, for a first audio signal (such as Sa1) is determined using a first model for a speaker such as speaker SK. As shown in step S20, it is determined whether beforehand compensation for the first audio signal is needed. In step S20, the determination can be made according to the first predicted parameter (such as predicted excursion). In another example, the determination can be made according to the first predicted parameter and a first detected parameter (such as detected excursion of the speaker SK). If compensation for the first audio signal (denoted by Sa1) is needed, step S30 is performed to generate a second audio signal (denoted by Sa2) by compensation according to the first model and the first detected parameter (denoted by PF1) and the first audio signal Sa1. If the compensation is not needed, the first audio signal Sa1 is outputted as the second audio signal Sa2 (or may be outputted by scaling), for example, as shown in step S25.

The method shown in FIG. 1 also considers protection for the speaker system according to one or more detected parameter obtained from the speaker system. In step S40, a third audio signal (denoted by Sa3) is generated through a gain control according to the second audio signal Sa2 and a gain value determined according to at least the first detected parameter (such as a detected excursion of the speaker SK) or a number of detected parameters (such as a detected excursion and a detected temperature of the speaker SK). In some examples, one or more detected parameters can be generated by way of using a feedback signal (denoted by Sfb) (e.g., an input voltage, a feedback current, etc.) from the speaker.

Regarding the determination in step S20, for example, one or more physical parameters (e.g., force factor Bl, stiffness K or others) for the speaker can be employed. For example, according to the first model, if the first predicted parameter enters a non-linear region of a physical parameter (e.g., force factor Bl, stiffness K) for the speaker, the first audio signal is expected to be reproduced by the speaker with distortions and thus the corresponding compensation is needed. Conversely, if the first predicted parameter lies on a linear region of the physical parameter, the first audio signal is expected to be reproduced by the speaker without distortion and thus the compensation is not necessary.

As to the compensation in step S30, non-linear compensation can be employed. For example, according to the first model and first predicted parameter, if the first audio signal Sa1 enters a non-linear region of a first physical parameter for the speaker, the first audio signal Sa1 is expected to be a distorted version, denoted by Sa1$d$, when reproduced by the speaker. In one example, the distorted version can be expressed, in terms of the first audio signal Sa1 and a distortion component (denoted by disn), by Sa1$d$(t)=m1*Sa1(t)+disn(t) (or may be expressed in digital form), wherein m1 indicates a scaling coefficient. In this manner, step S30 generates a second audio signal Sa2 by compensation according to the first model so that the second audio signal Sa2 includes an inverse component of the expected distortion component (denoted by disn$^{-1}$(t)). The second audio signal Sa2 can be expressed by: Sa2(t)=m*Sa1(t)+disn$^{-1}$(t), wherein m2 indicates a coefficient. Thus, when the speaker reproduces the second audio signal Sa2, the inverse component can compensate for the distortion so that the audio signal can be reproduced by the speaker with reduced or no distortion. The above example is not limiting to the implementation of step S30, and other detailed examples will be discussed later.

In another example, a first detected parameter (e.g., the detected excursion of the speaker) can be employed in step S20 and/or step S30 with respect to the actual parameter excursion of the speaker. Thus, time-adaptive non-linear compensation can also be employed when the first audio signal is delayed for look-ahead.

Referring to FIG. 2, the control apparatus 1 can be employed to perform the method as recited FIG. 1. The compensation unit 11 can be used to perform steps S10, S20, S25, and S30. The gain unit 13 can perform step S40. In response to the first audio signal Sa1 and a first detected parameter PF1, the compensation unit 11 outputs a second audio signal Sa2. In response to the second audio signal Sa2 and at least one detected parameter (such as the first detected parameter PF1 and/or second detected parameter PF2 and so on), the gain unit 13 outputs a third audio signal Sa3. A feedback unit 15 is employed to generate at least one detected parameter according to a feedback signal Sfb (such an input voltage, feedback current, etc.) from the speaker SK. In addition, the gain unit 13 outputs a parameter, such as a value Gc indicating the current (or present) gain value used in the gain unit 13, to the compensation unit 11 in order for the compensation unit 11 to adjust the compensation according to the current gain value.

In one embodiment, the control apparatus 1 includes a compensation unit 11, a gain unit 13, and a feedback unit 15. The feedback unit 15, in response to at least one feedback signal (indicated by Sfb) from a speaker SK, is for generating at least one detected parameter, e.g, PF1 and PF2. The compensation unit 11, in response to a first audio signal Sa1, is for generating a second audio signal Sa2, wherein the second audio signal Sa2 is generated selectively by compensation according to a first model for the speaker SK, a first detected parameter PF1 of the at least one detected parameter, the first audio signal Sa1, and a gain value, e.g., the value Gc. The gain unit 13, coupled to the compensation unit 11 to receive the second audio signal Sa2 and coupled to the feedback unit 15 to receive one or more of the at least one detected parameter, is for outputting the gain value and generating a third audio signal Sa3 according to the gain value.

The units of the control apparatus as described in the above embodiments can be realized or replaced by the corresponding units, or modules, or components as exemplified in the following and other embodiments.

Figure 3:
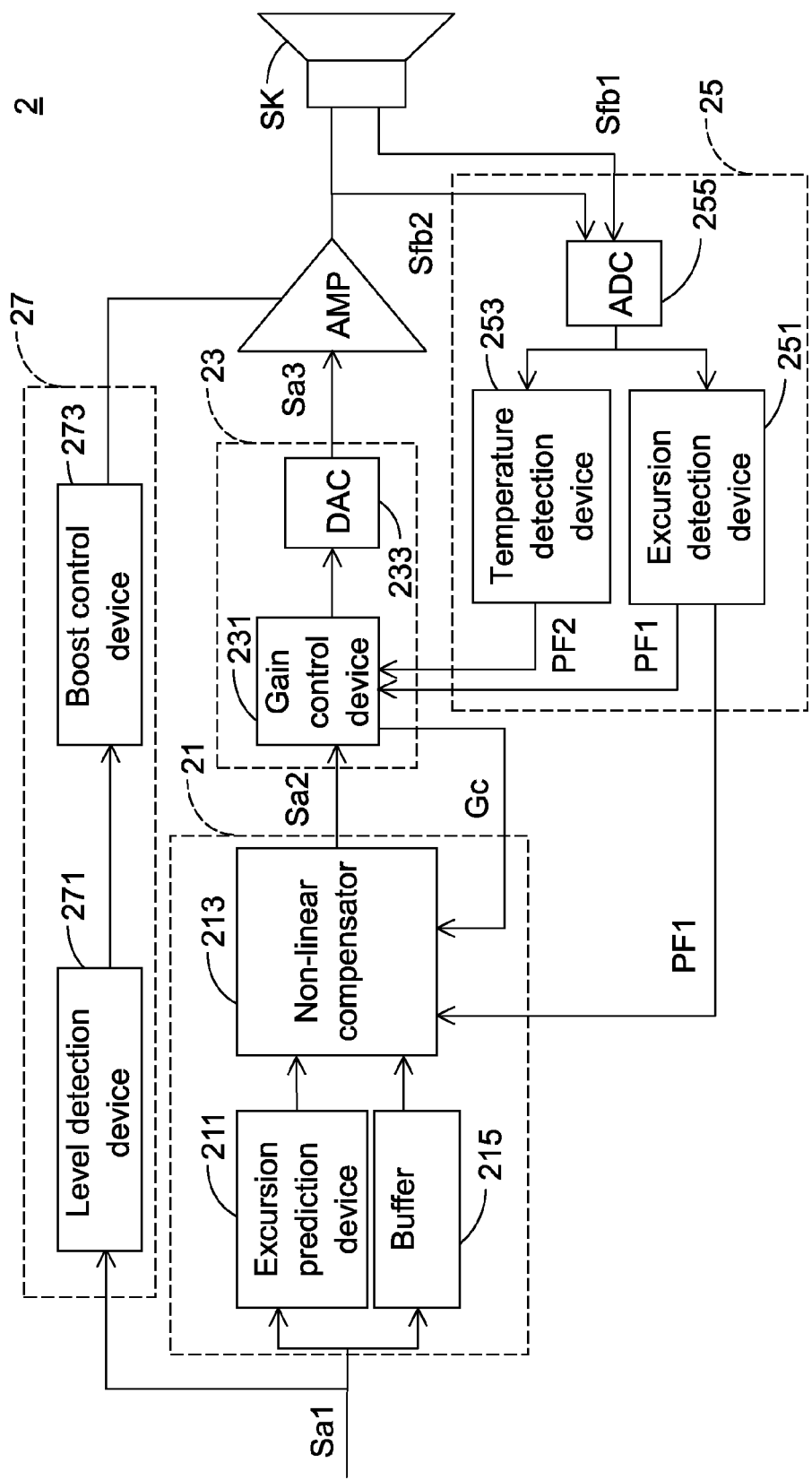
FIG. 3 shows a control apparatus for a speaker system according to another embodiment.

FIG. 3 shows a control apparatus for a speaker system according to another embodiment. FIG. 3 illustrates a structure for a control apparatus for a speaker SK according to an embodiment, which can be employed to perform the method as recited FIG. 1. The structure for a control apparatus 2 as shown in FIG. 3 includes a compensation unit 21, a gain unit 23, and a feedback unit 25. In FIG. 3, an input audio signal (or called a first audio signal) Sa1 is to be amplified by an amplifier AMP and then to be reproduced by the speaker SK.

In FIG. 3, the compensation unit 21 includes an excursion prediction device 211 for excursion calculation, a non-linear compensator 213, and a buffer 215. In an example, the compensation unit 21 performs look-ahead based compensation. The first audio signal Sa1, e.g., in the form of a digital signal, is looked ahead, for example, by using the buffer 215. In practical application, the first audio signal Sa1 may need to be conditioned or can be default as a conditioned signal, or a signal conditioning circuit stage can be optionally included in the control apparatus 2 for generating the conditioned signal for processing of the following stages. For the sake of explanation, the first audio signal Sa1 can be regarded as a conditioned signal in the embodiment. The excursion prediction device 211 predicts or evaluates the corresponding excursion of the first audio signal Sa1 through a first model for the speaker SK. The non-linear compensator 213 determines whether compensation is needed according to the delayed first audio signal from the buffer 215 and the predicted excursion outputted from the excursion prediction device 211. In addition, the non-linear compensator 213 generates a second audio signal Sa2 by compensation according to the first model and the first detected parameter (denoted by PF1), the value Gc from the gain control unit 23, and the delayed first audio signal Sa1, as exemplified by step S30. If compensation for the first audio signal Sa1 is not needed, the non-linear compensator 213 outputs the first audio signal as the second audio signal Sa2 (or may be outputted through a scaling), for example, as exemplified by step S25.

Figure 4:
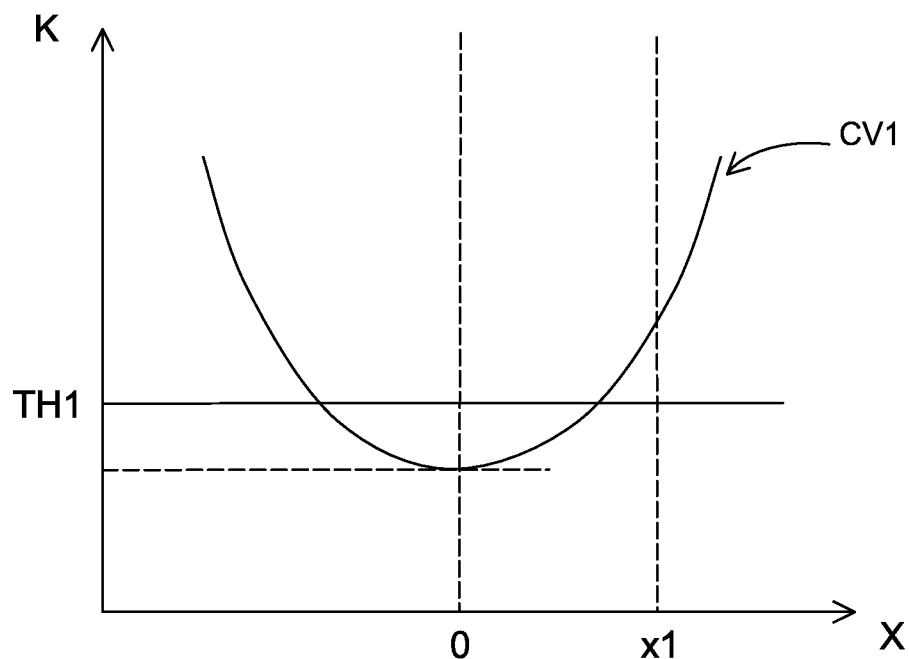
FIGS. 4-5 are graphs illustrating characteristics of a speaker.
Figure 5:
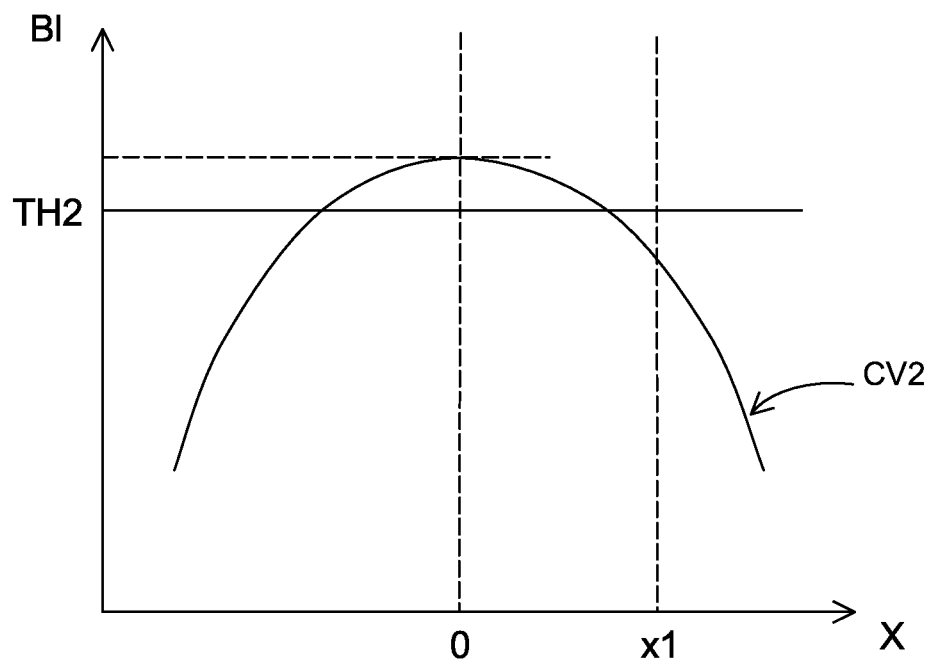

In determination as to whether compensation is needed, the non-linear compensator 213 may adopt one or more physical parameters of the speaker SK so as to determine whether the predicted first parameter (such as excursion) enters a non-linear region of the physical parameter, such as the ones illustrated in FIGS. 4 and 5. Referring to FIG. 4, a curve CV1 illustrates the stiffness K versus excursion X, wherein a predicted excursion x1 corresponds to a value on the curve CV1 above a threshold value TH1 and thus a non-linear region is entered. Referring to FIG. 5, a curve CV2 illustrates the force factor Bl versus excursion X, wherein a predicted excursion x1 corresponds to a value on the curve CV2 under a threshold value TH2 and thus a non-linear region is entered. The manners of determination are exemplary embodiments only and the implementation can be further performed by way of other approaches. As for the compensation, the non-linear compensator 213 may employ the examples as indicated above for step 30. In addition, the first model may be an equation for describing the physical characteristics of the speaker SK controlled by the system 2, for example.

In FIG. 3, the gain unit 23 includes a gain control device 231 and a digital-to-analog converter (DAC) 232. In response to the second audio signal Sa2 and at least one detected parameter (such as the first detected parameter PF1 and/or second detected parameter PF2 and so on), the gain control device 231 outputs an output audio signal. In one example, the output audio signal may be converted by the DAC 232 so as to output a third audio signal Sa3 for the amplifier AMP. In addition, the gain control device 231 outputs a parameter, such as a value Gc indicating the gain value currently used in the gain unit 13, to the non-linear compensator 213 in order for the non-linear compensator 213 to adjust the non-linear compensation according to the current gain value.

The feedback unit 15 is employed to generate at least one detected parameter according to a feedback signal Sfb indicating such as a feedback current signal Sfb1 and a feedback voltage signal Sfb2 from the speaker SK. The feedback unit 25 includes an excursion control device (or called an excursion detection device) 251, a temperature detection device (or called a temperature detection device) 253, and an analog-to-digital converter (ADC) 255. The feedback current Sfb1 and the feedback voltage Sfb2 are evaluated through the temperature detection device 251 and the excursion detection device 251, respectively, so as to generate a first detected parameter PF1 (e.g., the detected excursion of the speaker) and a second detected parameter PF2 (e.g., the temperature of the speaker). According to one or more detected parameters such as PF1 and PF2 and the second audio signal Sa2, the gain control device 231 adjusts its gain value. The first detected parameter PF1 (i.e., the detected excursion) generated by the excursion detection device 251 is adaptively fed back to the non-linear compensator 213.

For example, the excursion detection device 251 outputs the first detected parameter PF1 indicating the detected excursion of the speaker according to an impedance model, for example:

$$\frac{v - \dot{x} \cdot Bl(x)}{Z_e} = i, \quad \text{(equation 1)}$$

wherein $\dot{x}$ is time derivative of the excursion; i is the current which can be represented by the feedback current signal Sfb1; and v indicates the voltage which can be represented by the feedback voltage signal Sfb2; Bl(x) is the force factor of a speaker in terms of excursion x; and Ze is the impedance of the speaker SK. In an example, the equation 1 may be expressed in terms of discrete differential equation and the excursion x[n] can be solved accordingly. In one embodiment for protection of the speaker, when the first detected parameter PF1 indicates that the excursion of the speaker increases, the gain control device 231 can reduce the gain value so as to control the excursion of the speaker under the maximum excursion and avoid the speaker from damaging.

In an example, the temperature detection device 253 outputs the second detected parameter PF2 indicating the temperature of the speaker according to relationship between temperature and resistance, for example: $R=R_0[1+\alpha(T-T_\infty)]$ (equation 2), wherein the parameters $T_\infty$ is the ambient temperature and $R_0$ is the corresponding resistance; $\alpha$ is a substantially constant. The temperature change of the speaker is thus proportional to the resistance change and can be determined according to the detected resistance. In one embodiment for protection of the speaker, when the second detected parameter PF2 indicates that the temperature of the speaker increases, the gain control device 231 can reduce the gain value so as to control the temperature of the speaker and avoid the speaker from damaging.

As illustrated, the control apparatus 2 in FIG. 3 can further include a bias adjustment unit 27. The bias adjustment unit 27 includes a level detection device 271 and a boost control device 273. The level detection device 271 detects the level of the first audio signal Sa1 to determine whether the bias of the amplifier AMP needs to be boosted. The boost control device 273 according to the detection result from the level detection device 271 adjusts the level of the bias voltage supplied to the amplifier AMP.

Figure 6:
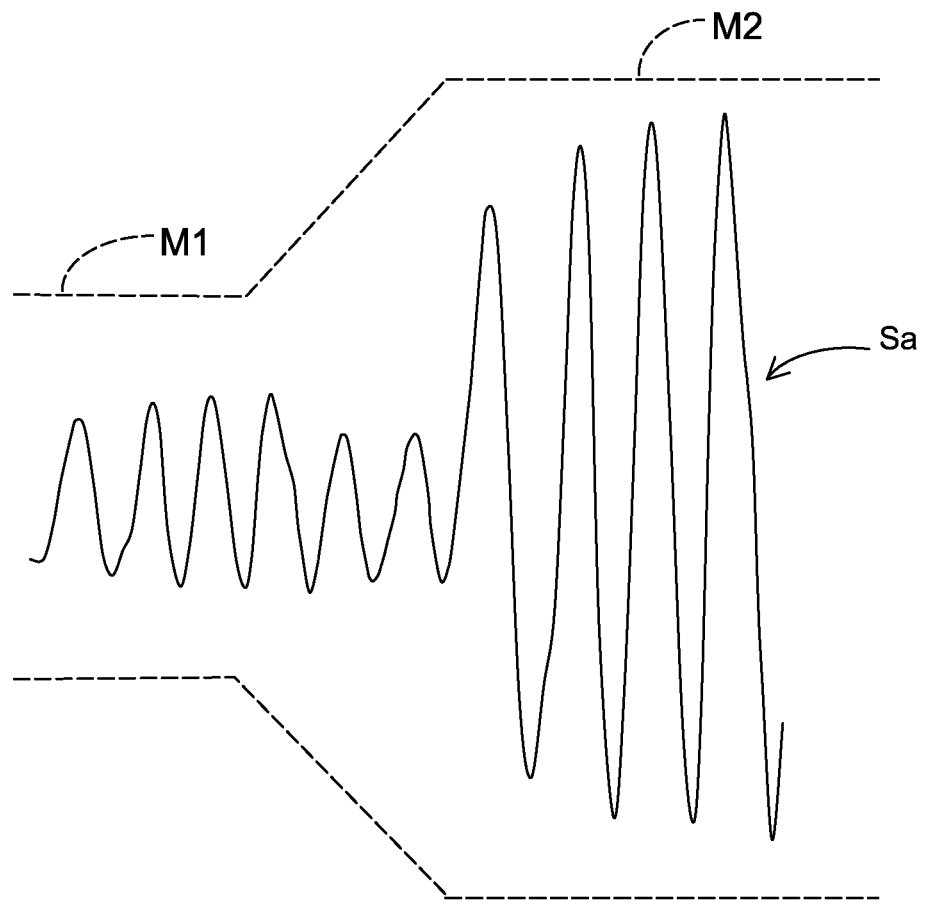
FIG. 6 illustrates an example of boosting a bias level dynamically in response to the signal level of an audio signal.

Referring to FIG. 6, an example of boosting a bias level dynamically in response to the signal level of a first audio signal is illustrated. In FIG. 6, the wave Sa represents an amplified audio signal and a smaller bias level M1 is provided when the audio signal is a small signal while a greater bias level M2 is provided before the amplified audio signal becomes a large signal.

In one embodiment, a control apparatus according to FIG. 3 employs the examples of the non-linear compensation with respect to the excursion of the speaker for improvement of the sound quality and the examples of gain control using at least the detected excursion for protection of the speaker can be provided.

In another embodiment, a control apparatus according to FIG. 3 uses the examples of the non-linear compensation with respect to the excursion of the speaker for improvement of the sound quality and the examples of gain control using at least the detected excursion and the detected temperature for protection of the speaker can be provided.

In further embodiment, a control apparatus according to FIG. 3 uses the examples of the non-linear compensation with respect to the excursion of the speaker for improvement of the sound quality and the examples of gain control using at least the detected excursion and the detected temperature for protection of the speaker and further the bias adjustment unit 27 can be provided.

For different applications and requirements for sound quality and hardware protection, one or more parameters can be employed in the non-linear compensation and gain control in different implementations of the control method and apparatus.

In practical applications, a portable apparatus, e.g., a mobile device, such as a smart phone, a super phone, a tablet computer and so on, the sound quality and the protection of the speaker are concerned. The audible sound reproduced by a speaker is typically limited its maximum excursion, temperature rising and transducer non-linearity. If the speaker is driven according to a rated power as provided by the manufacturer of the speaker, the overall performance will be limited due to the over protection of the speaker. Therefore, the loudness of the speaker is accordingly small. The above embodiments of a control apparatus according to FIG. 2 and FIG. 3 can be applied to these practical applications to facilitate an optimal loudness greater than that of the implementation under the limitation by the rated power while providing protection of the speaker for different levels or requirements. For different applications, product requirements, and different kinds of speakers, the parameters for non-linear compensation and the gain control can be selected and changed. Thus, the embodiments are not limited to the above. Further, a control method and apparatus using a feed forward and feedback control including non-linear compensation and feedback control from the speaker can be regarded as embodiments. A feed forward and feed back combined compensation for distortions of an input audio signal to be reproduced by a speaker system and a feedback control from the speaker for gain control and signal conditioning can also be employed as embodiments.

Figure 7:
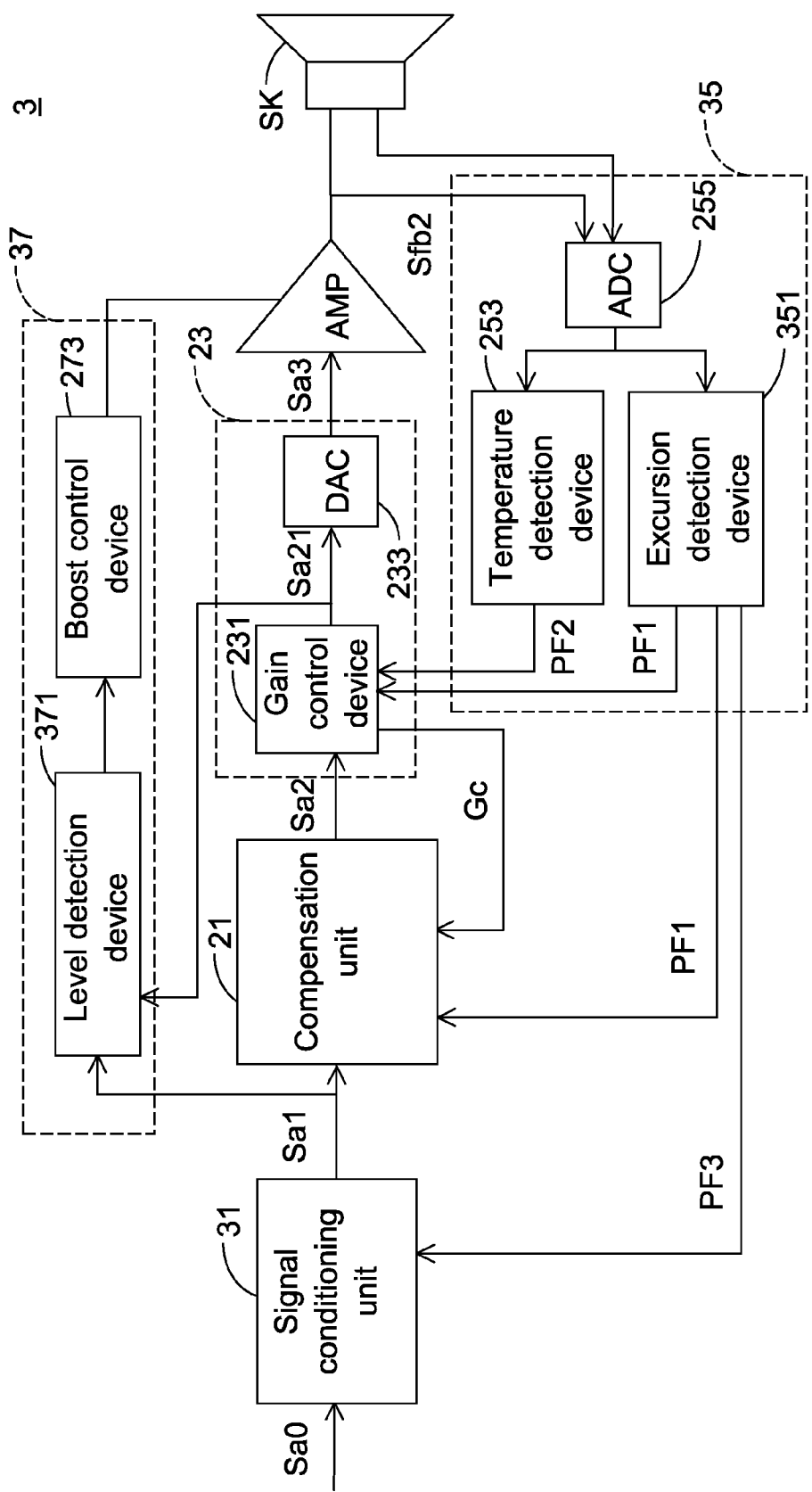
FIG. 7 illustrates a control apparatus for a speaker system according to another embodiment with resonant frequency tracking based conditioning.

Referring to FIG. 7, a control apparatus for a speaker system according to another embodiment is illustrated with dynamic resonant frequency tracking based conditioning. As compared to the control apparatus in FIG. 3, the control apparatus 3 in FIG. 7 further includes a signal conditioning unit 31 with resonant frequency tracking based conditioning. The signal conditioning unit 31 employs resonant frequency tracking and inversely compensated conditioning. That is, a signal processing operation, e.g., a signal filter for filtering an audio input signal according to a characteristic of inverse compensation, such as digital filter IIR, etc., can be implemented in the signal conditioning unit 31 to condition an audio input signal Sa0 (e.g., in a digital signal form). This filter has a characteristic of inverse and dynamic compensation with respect to the resonant peak of excursion by using the feedback voltage signal Sfb2 and feedback current signal Sfb1 and the corresponding impedance analysis.

Figure 8A:
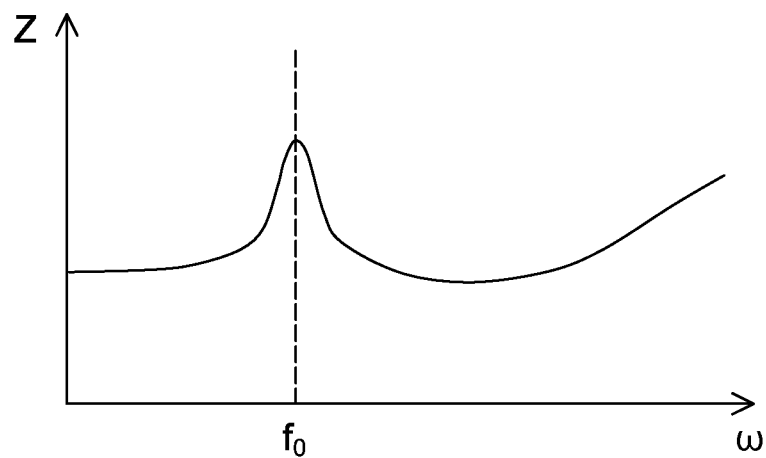
FIG. 8A shows a graph of the relationship between impedance and frequency detected from a speaker.
Figure 8B:
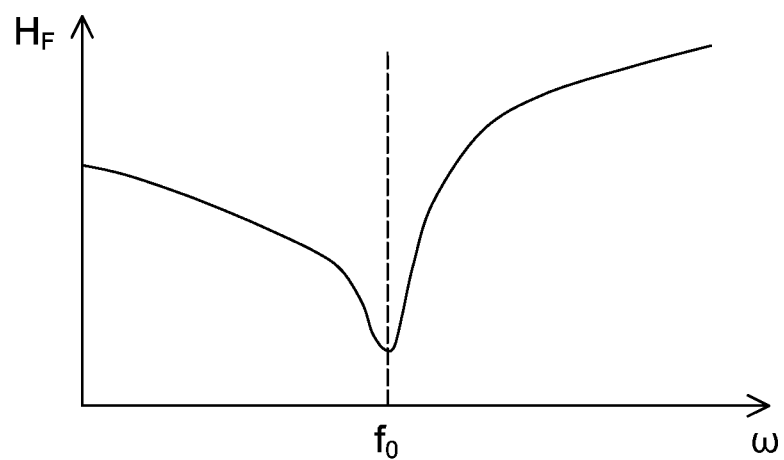
FIG. 8B illustrates a transfer function of a signal conditioning device according to the relationship indicated in FIG. 8A.
Figure 8C:
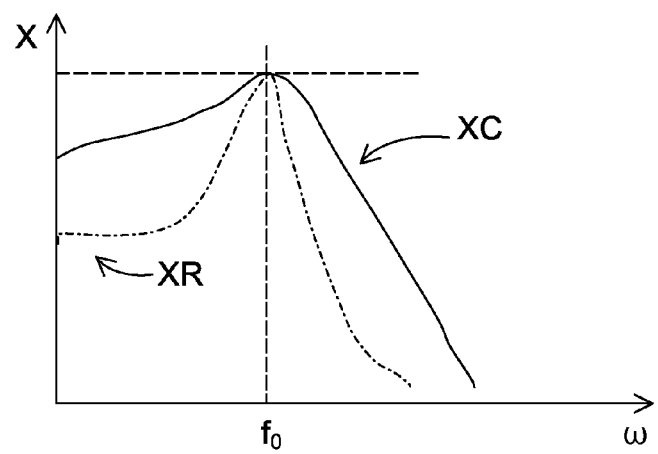
FIG. 8C shows a graph for comparison of the excursion corresponding to the reproduced audio signal outputted by an example of the control apparatus to the excursion of a speaker under a rated power, with respect to frequency.

In an exemplary embodiment in FIG. 7, the signal conditioning unit 31 receives a parameter PF3 representing the information of the current change in the resonant frequency for the speaker for resonant frequency tracking. The parameter PF3, for example, is generated by an excursion detection device 351 which receives feedback signals from the speaker. For example, the signal conditioning unit 31 is informed of an initial value of the resonant frequency and performs conditioning according to a characteristic of inverse compensation, or called transfer function $H_F$ as shown in FIG. 8B. The transfer function $H_F$, as exemplified in FIG. 8B, is obtained by inversion of the results for the impedance analysis, such as one shown in FIG. 8A. The transfer function $H_F$ is referred to as a characteristic of inverse compensation having a minimum corresponding to the resonant frequency for the speaker. In FIG. 8A, the relationship between impedance and frequency detected from the speaker is shown, wherein a resonant frequency $f_0$ is presented. As a result, the audio input signal Sa0 is modified and specifically reduced when the audio input signal Sa0 has frequency components close to the resonant frequency. In terms of digital signal values, the conditioned signal Sa1 has more headroom in bits for gain control. With the help of gain control as well as other processing of the subsequent stages of the control apparatus, the reproduced audio signal by the speaker can be boosted with gain levels over the characteristics. Referring to FIG. 8C, the excursion (denoted by XC) corresponding to the reproduced audio signal outputted by an example of the control apparatus is compared to the excursion (denoted by XR) of a speaker under a rated power, with respect to frequency. In FIG. 8C, the solid curve XC is relatively greater than the dashed curve XR over the frequency range. Accordingly, the loudness of the speaker can be enhanced with protection of the speaker.

Further, in case of the resonant frequency changed due to environmental influence or the aging of the speaker, the signal conditioning unit 31 can modify its transfer function with a tracked resonant frequency by way of the feedback, i.e., parameter PF3 from the feedback unit 35.

Moreover, all the function blocks (including implementation by using software modules, hardware components, device, or unit) has its own initial control parameters, such as maximum gain, the attack time, release time, etc., in the gain control unit, for example. In some embodiments, when the acoustical condition changing violently was sensed (e.g., by way of the feedback unit), the initial parameters should be switched to another set of parameters to ensure the robust of the control behavior. For example, the gain control device 231 detects the parameters PF1 and PF2 for the detected excursion and temperature, respectively. When the temperature is initially close to a temperature threshold, the gain control device 231 will switch the target gain value to a lower one. Similarly, when the excursion is far away from an excursion threshold, the gain control device 231 will switch the target gain value to a proper one. If the resonant frequency is changed due to acoustical condition change, the temperature and excursion thresholds should be switched to another set of thresholds to ensure the robust of the gain control behavior. In addition, the parameters such as elasticity of the speaker can also be concerned as the criteria for switching of the parameter sets.

In FIG. 7, the control apparatus 3 further differs from the control apparatus 2 in FIG. 3 in that a bias adjustment unit 37 in response to a signal from the gain control unit 23. For example, the level detection device 371 detects the conditioned input audio signal Sa1 and the processed audio signal Sa21 outputted from the gain control device 231. If one of the level of the signals Sa1 and Sa21 exceeds a threshold, the level detection device 371 triggers the boost control device 273. In addition, attack and release and other approach can be performed in the bias adjustment unit 37 to ensure an appropriate bias adjustment. For example, the bias boost level can be modified according to the latest figure of the processed audio signal Sa21 outputted from the gain control device 231.

Figure 9:
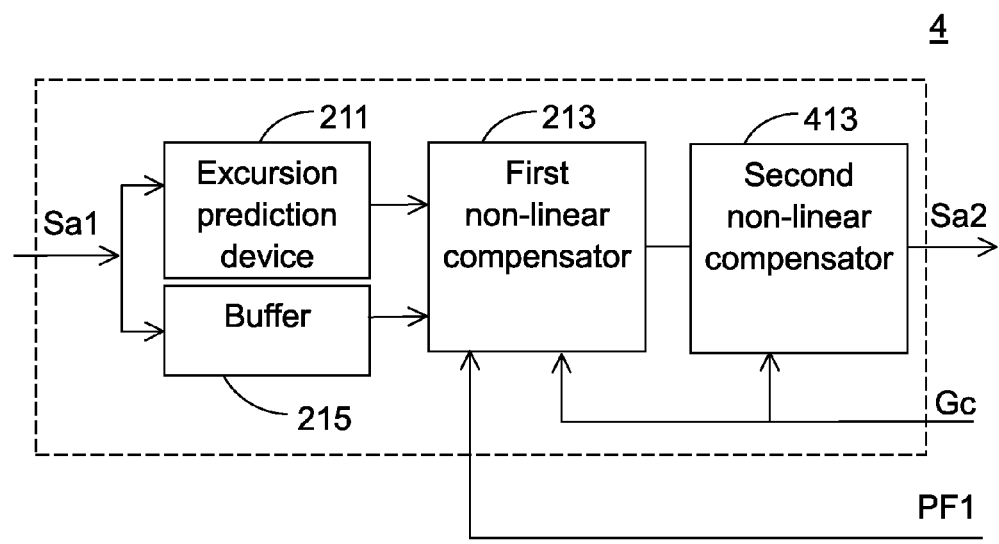
FIG. 9 illustrates a compensation unit including two non-linear compensators for different non-linearity physical models according to an embodiment.

Referring to FIG. 9, a compensation unit 4 includes two non-linear compensators for different non-linearity physical models according to an embodiment. The compensation unit 4 can be employed in FIG. 7 or other embodiments. As compared to the compensation unit 21 in FIG. 3, the compensation unit 4 further includes a second non-linear compensator 413 coupled to a first non-linear compensator 213.

In some cases, two or more different non-linearity physical models should be concerned in non-linear compensation. For example, an adaptive non-linear compensation including speaker nonlinearity and amplifier nonlinearity can be implemented for a speaker system using a switching power amplifier system (such as class-D amplifier). Nonlinear compensation for a specific amplifier such as class-D amplifier is required since such amplifier will induce aliasing due to its high frequency modulation characteristic and results in outband noise (distortions). In this case, the first non-linear compensator 213 is for non-linear compensation for speaker and the second non-linear compensator 413 is for non-linear compensation for amplifier. For example, the amplifier non-linearity is a fixed transfer function; that is, once such an amplifier was determined, its non-linear transfer function would be fixed. If a switching power amplifier was adopted, a filter should be introduced behind ADC 255 to filter the high-frequency component of the modulation feedback signals.

Figure 10:
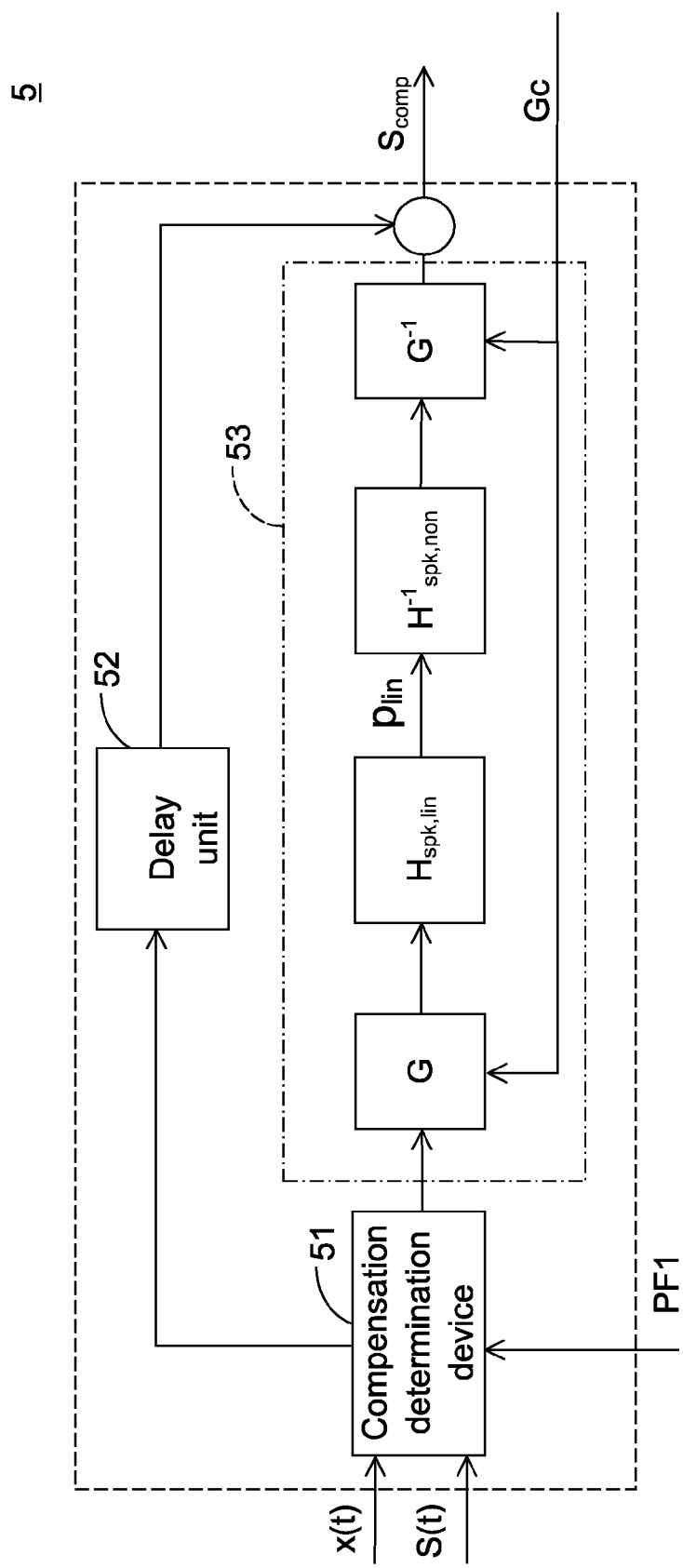
FIG. 10 illustrates an exemplary embodiment of a non-linear compensator in block diagram.

Referring to FIG. 10, an exemplary embodiment of a non-linear compensator in block diagram. For example, a non-linear compensator 5 in FIG. 10 is for speaker. The compensated audio signal, denoted by $S_{comp}$, can be expressed by:

$$S_{comp}(t) = p_{lin}(t) \otimes h_{spk,non}^{-1}(t) \otimes G(t)^{-1} \quad \text{(Equation 3)}$$

$$p_{lin}(t) = S(t) \otimes G(t) \otimes h_{spk,lin}(t) \quad \text{(Equation 4)}$$

wherein $p_{lin}(t)$ represents the convolution of the input audio signal S(t) and a gain function G(t) and the linear transfer function of the speaker $h_{spk,lin}(t)$ while $h_{spk,non}^{-1}(t)$ represents the inverse non-linear transfer function of the speaker, the gain function G(t) indicates the characteristics of the gain control unit in the subsequent stage and $G(t)^{-1}$ represents the inverse gain function. The non-linear compensation for speaker can be implemented according to equations 1 and 2, as shown in FIG. 10.

In FIG. 10, a compensation determination device (or module) 51 (or implemented as software control module) determines whether to enable or disable the compensation according to the calculated excursion x(t) and the detected excursion (PF1). If the compensation is not necessary, the audio signal S(t) (e.g., in digital form) can be bypassed to a delay unit 52 and outputted for the following stages. If the compensation is required, the audio signal S(t) will be processed by a compensation computation module 53, e.g., the following blocks (implemented by software processing or hardware circuit), to fulfill the equations 3 and 4 as exemplified above.

In another embodiment, a non-linear compensator for amplifier can also be derived according to equations 3 and 4, with the linear and inverse non-linear transfer functions of the speaker replaced by those for an amplifier (e.g., a switching power amplifier).

Figure 11:
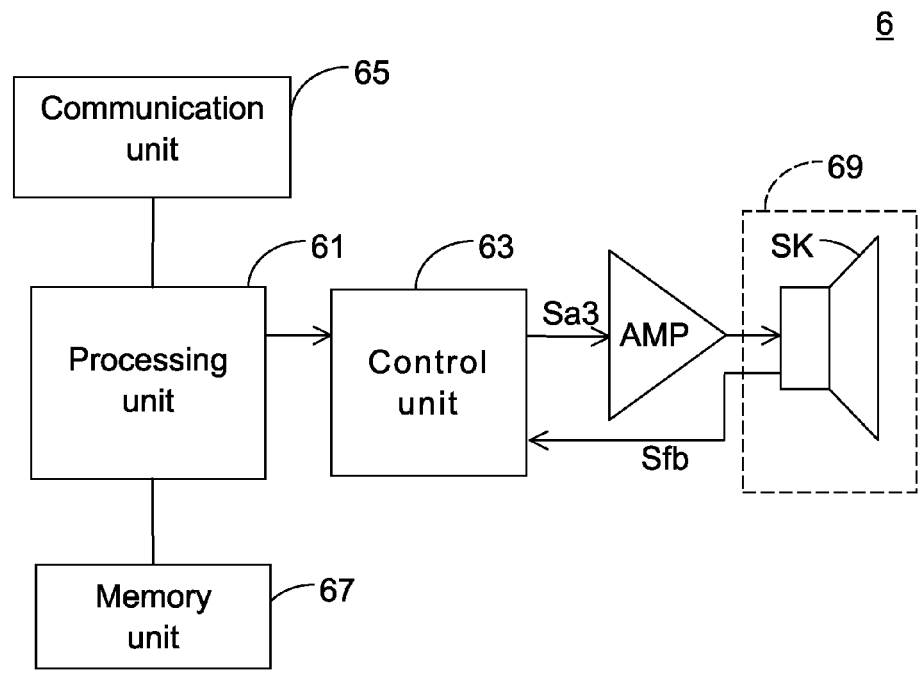
FIG. 11 illustrates an exemplary embodiment of a portable apparatus with a control unit for a speaker system in block diagram form.

Further, FIG. 11 illustrates an exemplary embodiment of a portable apparatus 6 with a control unit for a speaker system in block diagram form. The portable apparatus 6, e.g., a smart phone, a tablet computer, a notebook computer, a game machine, a multimedia player and so on, includes a processing unit 61, a control unit 63, an amplifier AMP, and a speaker system 69. The processing unit 61 may output an audio input signal (e.g., in digital form) when the portable apparatus 6 operates, e.g., when the portable apparatus 6 makes or receives a call, plays an audio file, such as music, speech, or sound stored in a memory unit 67, or playing an audio or video stream received through the communication unit 65, which may support one or more mobile and/or wireless communication modes, such as 2G, 3G, Wimax, LTE, 4G, Wi-Fi, and so on, and/or digital television or radio broadcast. The control unit 63, coupled between the processing unit 61 and the amplifier AMP, for driving the speaker system 69 (which may include one or more speakers for mono or stereo) through the amplifier AMP (which may include one or more amplifiers with one or more channels) according to a third audio signal Sa3.

The control unit 63, for example, includes a feedback unit, a compensation unit, and a gain unit, as exemplified above. The feedback unit, coupled to the speaker, generates a first detected parameter indicating a detected excursion of the speaker. The compensation unit generates a second audio signal based on the audio input signal (i.e., the audio input signal Sa0 or the input audio signal Sa1, as illustrated above), wherein the second audio signal is generated selectively by compensation according to the first detected parameter. The gain unit, coupled to the compensation unit and the feedback unit, determines a gain value according to the first detected parameter and generating the third audio signal Sa3 based on the second audio signal according to the gain value.

The control unit 63, in other examples, may be implemented based on a control apparatus according to one of the above embodiments, such as illustrated in FIG. 1, 2, 3, 7, 9, or 10. In addition, the control unit 63 can be realized, for example, by a processor, a digital signal processor, an application specific integrated circuit (ASIC) or a programmable integrated circuit such as a microcontroller and a field programmable gate array (FPGA) circuit, wherein the circuit is designed using such as hardware description language (HDL).

In other embodiments, a sound producing apparatus for a portable device is provided. The sound producing apparatus includes a speaker (such as SK) for producing an audible sound, a feedback unit (such as the feedback unit 15) coupled to the speaker, a compensation unit (such as the compensation unit 11), and a gain unit (such as the gain unit 13) coupled to the compensation unit and the feedback unit. The feedback unit generates a first detected parameter indicating a detected excursion of the speaker. The compensation unit generates a second audio signal based on a first audio signal, wherein the second audio signal is generated selectively by compensation according to the first detected parameter. The gain unit determines a gain value according to the first detected parameter and generating a third audio signal based on the second audio signal according to the gain value. The sound producing apparatus can also be realized by circuitry realizing the corresponding operations or acts of the feedback unit, compensation unit, and gain unit, and/or including other units, or modules, or components, as exemplified in the above embodiments, e.g., as illustrated in FIG. 2, 3, 7, 9, 10, or 11.

In other embodiments, a control method of sound producing for a portable device is provided. The control method includes the following. In step (a), a first detected parameter indicating a first detected excursion of a speaker of the portable device is generated, e.g., by a feedback unit 15. In step (b), a second audio signal is generated based on a first audio signal, e.g., by a compensation unit 11, wherein the second audio signal is generated selectively by compensation according to at least the first detected parameter. In step (c), a gain value such as value Gc is determined according to at least the first detected parameter and a third audio signal based on the second audio signal is generated according to the gain value, e.g., by a gain unit 13. In other embodiments, the foregoing control method can also be realized or replaced by steps corresponding to the operations or acts of the feedback unit, compensation unit, and gain unit, and/or including steps performed by other units, or modules, or components, as exemplified in the above embodiments.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A sound producing apparatus for a portable device, comprising:
   a speaker, for producing an audible sound;
   a feedback unit, coupled to the speaker, for generating a first detected parameter indicating a detected excursion of the speaker;
   a compensation unit, for generating a second audio signal based on a first audio signal, wherein the second audio signal is generated selectively by compensation according to the first detected parameter and a gain value; and
   a gain unit, coupled to the compensation unit and the feedback unit, for determining the gain value according to the first detected parameter and generating a third audio signal based on the second audio signal according to the gain value,
   wherein, the gain unit transports the gain value to the compensation unit.

2. The sound producing apparatus according to claim 1, wherein the compensation unit is operative to determine a first predicted parameter indicating a predicated excursion of the speaker with respect to the first audio signal; and to generate the second audio signal by compensation when the first predicted parameter enters a non-linear region of a force factor or stiffness for the speaker.

3. The sound producing apparatus according to claim 2, wherein the compensation unit comprises:
   a buffer for delaying the first audio signal for looking ahead;
   an excursion prediction device for predicting a corresponding excursion of the first audio signal as the first predicted parameter; and
   a nonlinear compensator, for determining, in response to the delayed first audio signal from the buffer and the first predicted excursion from the excursion prediction device, whether the first predicted parameter enters the non-linear region of the force factor or stiffness for the speaker, and for generating, in response to the delayed first audio signal and the gain value, the second audio signal based on the delayed first audio signal, the first predicted excursion, and the first detected parameter when the first predicted parameter enters the non-linear region of the force factor or stiffness for the speaker.

4. The sound producing apparatus according to claim 1, wherein
   the feedback unit is further operative to generate a second detected parameter indicating a detected temperature of the speaker, wherein when the second detected parameter indicates that the temperature of the speaker increases, the gain unit reduces the gain value so as to control the temperature of the speaker.

5. The sound producing apparatus according to claim 1, wherein the feedback unit comprises:
   an analog-to-digital converter, coupled to the speaker to receive at least one feedback signal;
   an excursion detection device, coupled to the analog-to-digital converter, for outputting the first detected parameter in response to the at least one feedback signal outputted from the analog-to-digital converter in digital form, according to an impedance model for the speaker; and
   a temperature detection device, coupled to the analog-to-digital converter, for outputting a second detected parameter in response to the at least one feedback signal according to a relationship between temperature and resistance for the speaker, wherein the second detected parameter indicates a temperature of the speaker;
   wherein the gain unit is operative to determine the gain value according to the first detected parameter and the second detected parameter.

6. The sound producing apparatus according to claim 1, wherein when the first detected parameter indicates that excursion of the speaker increases, the gain unit reduces the gain value so as to control the excursion of the speaker under a maximum excursion for the speaker.

7. The sound producing apparatus according to claim 1, further comprising:
   a bias adjustment unit is operative to:
   detect a signal level of the first audio signal and a signal level of a processed audio signal from the gain unit; and
   adjust a level of a bias signal if one of the signal levels exceeds a threshold, wherein the bias signal is supplied to an amplifier coupled to the speaker for reproduction in response to the third audio signal.

8. The sound producing apparatus according to claim 1, further comprising:
   a signal conditioning unit, coupled to the feedback unit, is operative to:
   receive from the feedback unit a parameter representing information with respect to a resonant frequency for the speaker;
   filter an audio input signal according to a characteristic of inverse compensation, wherein the characteristic of inverse compensation indicates a transfer function based on an inverse of a transfer function of excursion for the speaker having the resonant frequency for the speaker;
   output the first audio signal based on the filtered audio input signal, wherein the characteristic of inverse compensation has a minimum corresponding to the resonant frequency for the speaker, and the first audio signal substantially has more headroom in terms of bits than that of the audio input signal; and
   modify the transfer function indicating the characteristic of inverse compensation using the parameter representing information with respect to the resonant frequency for the speaker.

9. The sound producing apparatus according to claim 8, wherein the signal conditioning unit is further operative to reduce the audio input signal to output the first audio signal when the audio input signal has frequency components close to the resonant frequency for the speaker.

10. The sound producing apparatus according to claim 1, wherein the gain unit comprises:

a gain control device for outputting the gain value and generating a processed audio signal according to the gain value; and a digital-to-analog converter for outputting the third audio signal in response to the processed audio signal.

11. A control method of sound producing for a portable device, comprising:

(a) generating a first detected parameter via a feedback unit indicating a detected excursion of a speaker of the portable device;

(b) determining a gain value according to at least the first detected parameter and generating a second audio signal via a compensation unit based on a first audio signal, wherein the second audio signal is generated selectively by compensation according to at least the first detected parameter and the gain value; and (c) generating a third audio signal via a gain unit based on the second audio signal according to the gain value, wherein the gain unit is coupled to the compensation unit and the feedback unit, and the gain unit transports the gain value to the compensation unit.

12. The control method according to claim 11, wherein the step (b) comprises:

determining a first predicted parameter indicating a predicated excursion of the speaker with respect to the first audio signal; and generating the second audio signal by compensation when the first predicted parameter enters a non-linear region of a force factor or stiffness for the speaker.

13. The control method according to claim 11, wherein the step (b) comprises:

delaying the first audio signal for looking ahead;

predicting a corresponding excursion of the first audio signal as a first predicted parameter indicating a predicated excursion of the speaker with respect to the first audio signal;

in response to the delayed first audio signal and the first predicted excursion, determining whether the first predicted parameter enters a non-linear region of a force factor or stiffness for the speaker; and in response to the delayed first audio signal and the gain value, generating the second audio signal based on the delayed first audio signal, the first predicted excursion, and the first detected parameter when the first predicted parameter enters the non-linear region of the force factor or stiffness for the speaker.

14. The control method according to claim 11, further comprising:

generating a second detected parameter indicating a detected temperature of the speaker; and reducing the gain value so as to control the temperature of the speaker when the second detected parameter indicates that the temperature of the speaker increases.

15. The control method according to claim 11, wherein the step (a) comprises:

receiving at least one feedback signal from the speaker and outputting the at least one feedback signal in digital form;

in response to the at least one feedback signal outputted in digital form, outputting the first detected parameter according an impedance model for the speaker; and outputting a second detected parameter in response to the at least one feedback signal according to a relationship between temperature and resistance for the speaker, wherein the second detected parameter indicates a temperature of the speaker;

wherein in the step (c), the gain value is determined according to the first detected parameter and the second detected parameter.

16. The control method according to claim 11, wherein when the first detected parameter indicates that excursion of the speaker increases, the gain value is reduced to control the excursion of the speaker under a maximum excursion for the speaker.

17. The control method according to claim 11, further comprising:

detecting a signal level of the first audio signal and a signal level of a processed audio signal from the gain unit; and adjusting a level of a bias signal if one of the signal levels exceeds a threshold, wherein the bias signal is supplied to an amplifier coupled to the speaker for reproduction in response to the third audio signal.

18. The control method according to claim 11, further comprising:

receiving a parameter representing information with respect to a resonant frequency for the speaker;

filtering an audio input signal according to a characteristic of inverse compensation, wherein the characteristic of inverse compensation indicates a transfer function based on an inverse of a transfer function of excursion for the speaker having the resonant frequency for the speaker;

outputting the first audio signal based on the filtered audio input signal, wherein the characteristic of inverse compensation has a minimum corresponding to the resonant frequency for the speaker, and the first audio signal substantially has more headroom in terms of bits than that of the audio input signal; and reducing the audio input signal to output the first audio signal when the audio input signal has frequency components close to the resonant frequency for the speaker.

19. The control method according to claim 18, further comprising:

modifying the transfer function indicating the characteristic of inverse compensation using the parameter representing information with respect to the resonant frequency for the speaker.

20. A portable apparatus, comprising:

a processing unit, wherein the processing unit outputs an audio input signal;

a speaker;

an amplifier, coupled to the speaker; and a control apparatus, coupled between the processing unit and the amplifier, for driving the speaker through the amplifier according to a third audio signal, comprising:

a feedback unit, coupled to the speaker, for generating a first detected parameter indicating a detected excursion of the speaker;

a compensation unit, for generating a second audio signal based on the audio input signal, wherein the second audio signal is generated selectively by compensation according to the first detected parameter and a gain value; and a gain unit, coupled to the compensation unit and the feedback unit, for determining the gain value according to the first detected parameter and generating the third audio signal based on the second audio signal according to the gain value, wherein, the gain unit transports the gain value to the compensation unit.

* * * * *